United States Patent
Anaya Calvo et al.

(10) Patent No.: US 10,403,557 B2
(45) Date of Patent: Sep. 3, 2019

(54) BONDING SCHEME FOR DIAMOND COMPONENTS WHICH HAS LOW THERMAL BARRIER RESISTANCE IN HIGH POWER DENSITY APPLICATIONS

(71) Applicant: Element Six Technologies Limited, Oxfordshire (GB)

(72) Inventors: Julian Anaya Calvo, Bristol (GB); Martin Hermann Hans Kuball, Bristol (GB); Julian James Sargood Ellis, Oxfordshire (GB); Daniel James Twitchen, Oxfordshire (GB)

(73) Assignee: ELEMENT SIX TECHNOLOGIES LTD (GB)

( * ) Notice: Subject to any disclaimer, the term of this patent is extended or adjusted under 35 U.S.C. 154(b) by 0 days.

(21) Appl. No.: 15/531,900

(22) PCT Filed: Nov. 23, 2015

(86) PCT No.: PCT/EP2015/077324
§ 371 (c)(1),
(2) Date: May 31, 2017

(87) PCT Pub. No.: WO2016/087243
PCT Pub. Date: Jun. 9, 2016

(65) Prior Publication Data
US 2017/0330816 A1    Nov. 16, 2017

(30) Foreign Application Priority Data
Dec. 1, 2014    (GB) .................................. 1421259.1

(51) Int. Cl.
*H01L 23/373*    (2006.01)
*C04B 37/00*    (2006.01)
(Continued)

(52) U.S. Cl.
CPC ........ *H01L 23/3732* (2013.01); *C04B 37/006* (2013.01); *C09K 5/14* (2013.01);
(Continued)

(58) Field of Classification Search
CPC .................................................... H01L 23/3732
See application file for complete search history.

(56) References Cited

U.S. PATENT DOCUMENTS

| 3,872,496 A | 3/1975 | Potter et al. |
| 6,114,256 A | 9/2000 | Bachli et al. |

(Continued)

FOREIGN PATENT DOCUMENTS

| EP | 1430007 A1 | 6/2004 |
| EP | 1452614 A1 | 9/2004 |

(Continued)

OTHER PUBLICATIONS

Chandran et al, A Novel Bonding Technique to Bond CTE Mismatched Devices, 1996 Electronic Components and Technology Conference, p. 1151-1158, ISSN: 0569-5503.
(Continued)

*Primary Examiner* — Daniel P Shook
(74) *Attorney, Agent, or Firm* — Bryan Cave Leighton Paisner LLP

(57) ABSTRACT

A semiconductor device comprising:
a semiconductor component;
a diamond heat spreader; and
a metal bond,
wherein the semiconductor component is bonded to the diamond heat spreader via the metal bond,
wherein the metal bond comprises a layer of chromium bonded to the diamond heat spreader and a further metal layer disposed between the layer of chromium and the semiconductor component, and
(Continued)

wherein the semiconductor component is configured to operate at an areal power density of at least 1 kW/cm$^2$ and/or a linear power density of at least 1 W/mm.

15 Claims, 8 Drawing Sheets

(51) Int. Cl.
    *C09K 5/14*     (2006.01)
    *H01L 23/498*     (2006.01)

(52) U.S. Cl.
    CPC .. *H01L 23/49811* (2013.01); *H01L 23/49866* (2013.01); *C04B 2235/722* (2013.01); *C04B 2235/963* (2013.01); *C04B 2235/9607* (2013.01); *C04B 2237/12* (2013.01); *C04B 2237/122* (2013.01); *C04B 2237/125* (2013.01); *C04B 2237/363* (2013.01); *C04B 2237/708* (2013.01); *C04B 2237/72* (2013.01); *H01L 23/3735* (2013.01); *H01L 23/3736* (2013.01); *H01L 2924/0002* (2013.01)

(56) References Cited

U.S. PATENT DOCUMENTS

| | | | |
|---|---|---|---|
| 6,531,226 | B1 | 3/2003 | Petkie |
| 2002/0074649 | A1* | 6/2002 | Chrysler ............... H01L 23/36 257/720 |
| 2005/0051891 | A1 | 3/2005 | Yoshida et al. |
| 2012/0231216 | A1 | 9/2012 | Zimmer et al. |

FOREIGN PATENT DOCUMENTS

| | | |
|---|---|---|
| JP | H09186276 A | 7/1997 |
| JP | 2007189171 | 7/2007 |
| WO | 2009013714 A1 | 1/2009 |

OTHER PUBLICATIONS

Han Yong et al, Enhancement of Hotspot Cooling with Diamond Heat Spreader on Cu Microchannel Heat Sink for GaN-on-si Device, IEEE Transactions on Components, Packaging and Manufacturing Technology, No. 6, Jun. 1, 2014, pp. 983-990, vol. 4.
Balmer et al, Integrating Diamond to Maximize Chip Reliability and Performance, Chip Scale Review, No. 4, Aug. 2013, pp. 26-30, vol. 17.
Sheen et al, The Influence of Thermal Aging on Joint Strength and Fracture Surface of Pb/Sn and Au/Sn Solders in Laser Diode Packages, Journal of Electronic Materials, No. 8, 2002, pp. 895-902, vol. 31.
Liu et al, Design and Implementation of Metallization Structures for Epi-Down Bonded High Power Semiconductor Lasers, Science and Technology Center, 2004, pp. 798-806.
Palstra et al, Magnetic and Electrical Properties of Several Equiatomic Ternary U-Compounds, Journal of Magnetism and Magnetic Materials 67, 1987, pp. 331-342.
G.Ghosh, Dissolution and Interfacial Reactions of thin-film Ti/Ni/Ag Metallizations in Solder Joints, Acta Mater, 2001, pp. 2609-2624.
Monachon et al, Thermal boundary conductance of transition metals on diamond, Emerging Materials Research, 2012, pp. 89-98, vol. 1.
Chu et al, Thermal conductivity of SPS consolidated CU/diamond composites with Cr-coated diamond particles, Journal of Alloys and Compounds, 2010, pp. 453-458.
Combined Search and Examination Report for GB1421259.1 dated Jun. 8, 2015.
Combined Search and Examination Report for GB1520594.1 dated Oct. 10, 2016.
Search Report and Written Opinion for PCT/EP2015/077324 dated Feb. 9, 2016.

* cited by examiner

US 10,403,557 B2

BONDING SCHEME FOR DIAMOND COMPONENTS WHICH HAS LOW THERMAL BARRIER RESISTANCE IN HIGH POWER DENSITY APPLICATIONS

FIELD OF INVENTION

The present invention relates to a bonding scheme for diamond components which has low thermal barrier resistance at high power densities. Certain embodiments relate to the bonding of high power density semiconductor components to a diamond heat spreader. Certain further embodiments relate to a metallized diamond heat spreader suitable for such applications.

BACKGROUND OF INVENTION

The promised performance of wide band gap electronic devices (e.g. GaN, SiC, and GaAs based devices) will result in much high power dissipation and localized heat generation at contacts and in channel regions than can be accommodated by current state-of-the-art thermal management configurations. As a consequence, use of conventional cooling techniques imposes a ceiling on wide band gap device performance and reliability. Overcoming such barriers requires thermal engineering at the macro, micro, and nano-scale, which can provide significant reductions in the near-junction temperature rise and component thermal resistance.

Specific challenges relate to heat spreading in certain types of radio frequency (rf) power devices. In such devices the local power densities can exceed, for example, 1 MW/cm$^2$. Spreading this heat and lowering the junction temperature enables increased reliability and also continuous wave performance. In addition to electronic device applications, there is also a need to improve upon current state-of-the-art thermal management configurations in certain extreme optical applications.

Synthetic diamond materials have been proposed as an ideal solution in extreme thermal management applications due to the high in-plane thermal conductivity of such materials. For example, various grades of synthetic diamond material grown by chemical vapour deposition (CVD) are already commercially available for thermal heat spreading applications including both polycrystalline and single crystal synthetic diamond materials.

One problem with using diamond materials in such application is that diamond materials can be difficult to bond to other components and this is a particular issue when used in high power density applications where any bonding will be subject to large changes in temperature and where the thermal barrier resistance becomes critical to device performance. Metallization of diamond heat-spreaders is required to provide a wettable surface for die-attachment. While diamond is known to be an excellent room temperature heat spreader, its usefulness in reduction of device junction temperatures is reduced by the TBR (thermal barrier resistance) associated with its method of attachment to electrical devices.

Typically, for reasons of adhesion and mechanical robustness, three-layer metallization schemes are used for bonding of diamond components. An example of such a three-layer metallization scheme comprises: (i) a carbide forming metal layer which forms a carbide bonding to the diamond component; (ii) a diffusion barrier metal layer disposed over the carbide forming metal layer; and (iii) a surface metal bonding layer disposed over the diffusion barrier metal which provides both a protective layer and a solderable/wettable surface layer onto which a metal solder or metal braze can be applied to bond the diamond component to another device component. A particular example of such a three-layer metallization scheme is Ti/Pt/Au and typically diamond heat spreading components are sold in metallized form coated with such a three-layer metallization structure such that other components can ready be mounted and bonded to the diamond component using a solder or braze.

In general, as well as mechanical attachment, the layered metallization coating should be consistent with low thermal barrier resistance, such as to maximize the effectiveness of a diamond heat spreader bonded to a high power density semiconductor component.

Across a diamond-metal-semiconductor interface in such an application, heat transport is a non-trivial physics process, alternating between phonon and electron transport processes with different scattering mechanisms. Despite the actual thickness of some of the formed interfaces being very low, for example the titanium layer forming a titanium carbide bond with the diamond surface can be very thin (only tens of nanometers), these interfaces can add considerably to the thermal resistance and hence effectiveness of the thermal solution and this is particularly problematic in high power density applications.

Following on from the above, the present inventors have revisited the problem of mounting and bonding diamond components with the aim of providing a bonding methodology which has improved functional performance in terms of lower thermal barrier resistance when used in high power density applications.

SUMMARY OF INVENTION

The effect of thermal resistance scales with increased power density. The present inventors have recognized that a class of devices with power densities of at least 1 kW/cm$^2$ benefit substantially in terms of reduced junction temperature for a given power density, if the standard titanium-platinum based metallization scheme is replaced with an alternative chromium based metallization scheme.

One aspect of the present invention provides a semiconductor device comprising:
  a semiconductor component;
  a diamond heat spreader; and
  a metal bond,
    wherein the semiconductor component is bonded (i.e. adhered) to the diamond heat spreader via the metal bond,
    wherein the metal bond comprises a layer of chromium bonded (i.e. adhered) to the diamond heat spreader and a further metal layer disposed between the layer of chromium and the semiconductor component, and
    wherein the semiconductor component is configured to operate at an areal power density of at least 1 kW/cm$^2$ and/or a linear power density of at least 1 W/mm.

The metal bond may also comprise a solder or braze. In this case, the further metal layer can be selected to be a metal which provides a solderable/wettable surface layer onto which a metal solder or metal braze can be applied to bond the diamond heat spreader to the semiconductor component. An example of such a metal is gold. As such, the bond may comprise a chromium layer bonded to the diamond heat spreader, a gold layer over the chromium layer, and a metal solder or metal braze, such as a tin-based solder, disposed between the gold layer and the semiconductor component. For example, a chromium and gold metallization coating may be provided on the diamond component and this can then be soldered or braze bonded to the semiconductor component using a tin-based solder. The semiconductor component may itself have a metallization coating which will be discernible in the final bond as a metal layer disposed between the solder or braze and the semiconductor component. However, it will also be noted that during the bonding process there will be some intermixing of the solder or braze metal and the metallization coatings on the diamond and semiconductor components. For example, when a Cr/Au metallization is provided on the diamond component and a tin solder is used to bond the diamond component to the semiconductor component then the final bond will comprise a chromium layer bonded to the diamond (forming a chromium carbide interface with the diamond) and a mixed AuSn layer including gold-tin intermetallic compounds.

Alternatively, if for example a diffusion bonding method is used rather than a solder or braze, then the bond may only consist of a chromium layer and a gold layer (or other suitable metal layer which can be diffusion bonded). For example, a chromium and gold metallization coating may be provided on the diamond component and a gold metallization coating may be provided on the semiconductor component and then the two gold layers can be diffusion bonded together.

According to another aspect of the present invention there is provided a metallized diamond heat spreader comprising:
a diamond heat spreader; and
a metal coating disposed on the diamond heat spreader, wherein the metal coating comprises a layer of chromium bonded to the diamond heat spreader and a further metal layer disposed over the layer of chromium, and wherein the diamond heat spreader has one or more of the following characteristics:
a surface roughness Rq of no more than 1000 nm, 500 nm, 100 nm, 50 nm, 20 nm, 10 nm, or 5 nm;
a thermal conductivity of at least 1000 W/mK, 1300 W/mK, 1500 W/mK, 1800 W/mK, or 2000 W/mK;
a nitrogen concentration of less than 20 p$\mu$m;
a low or absent graphitic sp2 carbon signal as assessed by Raman at an excitation wavelength of 633 nm; and
a Raman full width half maximum (FWHM) peak width of no more than 20, 10, 8, 5, 3, 2, or 1.5 cm$^{-1}$.

For example, the metal coating may consist of a two-layer structure including a chromium layer and a layer of gold (or other suitable metal which can provide a solderable/wettable surface layer or a diffusion bond) as compared to the standard three-layer structure of titanium-platinum-gold. In this case, the barrier layer of platinum can be dispensed with as the chromium itself functions as an effective diffusion barrier. This reduces the number of thermal barrier interfaces in the bond as well as reducing the formation of intermetallic compounds which increase thermal barrier resistance. When the diamond component is bonded to another component using a solder or braze then the final bond will generally have the layer structure chromium/gold/solder. Alternatively, if the gold layer coating the diamond component is diffusion bonded to another gold layer on the other device component then a solder or braze may be dispensed with.

The metallized diamond heat spreader as defined above can be used in high power density semiconductor devices. Furthermore, the metallized diamond heat spreader may also be used as an optical component in high power optical devices. In the latter case, a low optical absorption grade of diamond material is selected for the diamond component such that both thermal and optical requirements are met for such applications.

BRIEF DESCRIPTION OF THE DRAWINGS

For a better understanding of the present invention and to show how the same may be carried into effect, embodiments of the present invention will now be described by way of example only with reference to the accompanying drawings, in which.

DETAILED DESCRIPTION

Figure 1A:
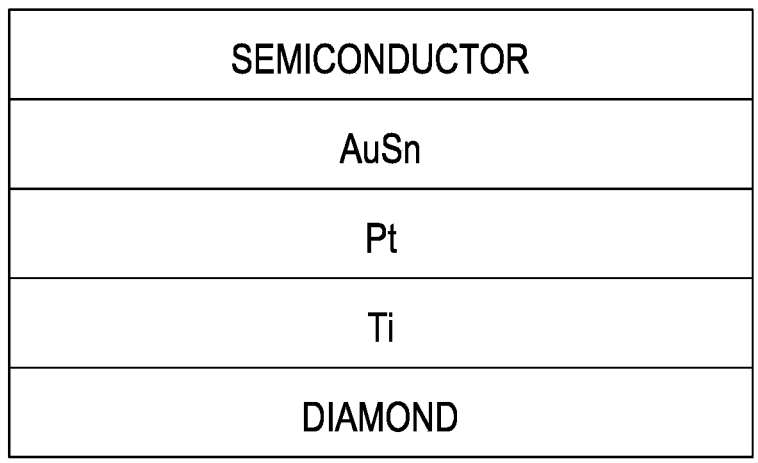
FIGS. 1(a) and 1(b) show cross-sectional illustrations of a semiconductor component bonded to a diamond heat spreader using a standard Ti/Pt metallization scheme and an alternative Cr metallization scheme respectively.

As described in the summary of invention section, one aspect of the present invention is to provide a high power density semiconductor component bonded to a diamond heat spreader via a chromium-based metal bonding scheme. It has been found that for high power density applications a chromium-based bonding scheme, e.g. Cr/Au, yields a much lower thermal barrier resistance leading to much lower junction temperatures when operating at such high power densities compared with the standard titanium-platinum bonding solution, e.g. Ti/Pt/Au.

The diamond component can be provided with a two layer metallization structure including a layer of chromium bonded to the diamond component forming chromium carbide and metal layer, such as gold, silver, tantalum, or tin, disposed over the chromium layer and providing a surface layer which is suitable for bonding via a solder, a braze, or via diffusion boding to another component. For example, the second metal layer may be a gold layer or may comprise gold and tin. In one configuration the metallization coating on the diamond is Cr/Au and a tin solder is used to bond the coated diamond component to another component such as a semiconductor die.

The present invention is illustrated herein by comparing two different types of bonding structure:
(i) a device structure which utilizes a standard titanium-platinum-gold metallized diamond heat spreader and a tin-based solder to bond the semiconductor component to the metallized diamond heat spreader such that the bonded device structure comprises the layer structure-diamond/Ti/Pt/AuSn/semiconductor component; and
(ii) a device structure which utilizes a chromium-gold metallized diamond heat spreader and a tin-based solder to bond the semiconductor component to the metallized diamond heat spreader such that the bonded device structure comprises the layer structure-diamond/Cr/AuSn/semiconductor component.

Chromium has previously been proposed as a possible bonding metal for diamond materials as it is a carbide forming metal which can adhere to diamond materials by forming a carbide with a surface layer of carbon in the diamond material. However, a titanium-platinum bonding solution has become the standard due to advantages in terms of mechanical strength of the bonding. Furthermore, at standard power densities there is little difference in thermal performance between chromium based bonding and titanium-platinum based bonding. What the present inventors have surprisingly found is that for very high power density applications a chromium-based bonding scheme yields a much lower thermal barrier resistance leading to much lower junction temperatures when operating at such high power densities compared with the standard titanium-platinum bonding solution. As such, it has been found that for these very high power density applications a chromium-based bonding scheme is preferred over a standard titanium-platinum bonding solution. While the thermal advantages of using chromium at lower power densities are not significant, at very high power densities they become very significant and can out-weigh any mechanical advantages of using a standard titanium-platinum bonding scheme. While not being bound by theory, the reason why a chromium bonding scheme has a lower thermal barrier resistance than a titanium-platinum bonding scheme is outlined below.

The standard Ti/Pt/Au metallization scheme is very reactive when applied to soldering schemes such as a Sn-based solder, having some features which can result in a poorer thermal management under high power dissipation conditions. It is well established that the thermal conductivity of AuSn or AgSn solders are around 50-70 W/mK. However, the interaction of these alloys with elements in the metallization can result in a reduction from these values. When the Sn diffuses to the Au layer it results in the formation of several intermetallic compounds like Au5Sn, AuSn4, and others (Reliability and Failure of Electronic Materials and Devices By Milton Ohrin, M. T. Sheen Journal of electronic materials, 31, 8, 895, (2002)). These intermetallic formations can promote the apparition of defects like Kirkendall voids or micro-cracks which ultimately impact negatively on thermal transport. In the Ti/Pt/Au metallization scheme, it has been demonstrated that the Sn can diffuse to the Pt-diffusion barrier, and ultimately even reach the Ti layer (X. Liu et al. Electronic Components and Technology Conference, 2004. Proceedings. 54th, vol. 1, no., pp. 798,806 Vol. 1, 1-4 Jun. 2004). This results in the formation of different intermetallic compounds in the near diamond interface region which has a strong impact on thermal transport across this interface. For instance, the formation of TiPtSn, which has a resistivity of 0.51 μΩ/W, supresses electronic thermal transport which is the most important thermal transport mechanism in metals (T. T. M Palstra et al., Journal of Magnetism and Magnetic Materials 67 (1987) 331-342), while the formation of $Pt_xTi$, $PtTi_y$ and PtSn creates a region in which the lattice thermal conductivity is severely disturbed by the disorder created by the existence of these compounds. Ultimately, it has been demonstrated that the Pt may completely reacts with the Sn, allowing the reaction of the Ti with the Au and Sn by forming Au—Sn—Ti compounds under typical device temperature operation (G. GHOSH Acta mater. 49 (2001) 2609-2624). Therefore, the use of the standard Ti/Pt/Au metallization scheme with a (Au/Ag)Sn solder introduces a heavily disordered region in the near diamond interface which ultimately introduces a thermal barrier which can be very important when it comes to dissipate high energy densities. When a simple Cr/Au scheme is used instead of the Ti/Pt/Au, it has been demonstrated that the Cr does not form any intermetallic compounds, being a very efficient diffusion barrier for Sn (X. Liu et al. Electronic Components and Technology Conference, 2004. Proceedings. 54th, vol. 1, no., pp. 798,806 Vol. 1, 1-4 Jun. 2004). The use of Cr therefore enables thermal transport without adding thermal barriers, boosting thermal management under high power dissipation densities. On the other hand, the transference of energy from the diamond to other materials is not a trivial issue; this transference requires a phonon-phonon and phonon-electron coupling between materials which depends on the phonon density of states and scattering mechanisms across the metal/diamond junction. This energy transference is related to the difference in sound velocities and Debye temperatures in between the diamond and the metal, resulting in a high thermal boundary resistance (TBR) between very dissimilar materials. In this case, a diffuse mismatch model indicates that the energy transference at a Cr/Diamond interface is more than eight times higher than for a Ti/Diamond interface. As a matter of fact, the Cr/Diamond interface has been demonstrated to be one of the most efficient interfaces for the transference of heat from/to the diamond (Monachon and Weber, Emerging Materials Research, Volume 1 Issue EMR2, 89-98 (2012)), for instance having being used for boosting the thermal transference in Cu/Diamond matrix compounds when the diamond is coated with Cr (K. Chu et al. Journal of Alloys and Compounds 490 (2010) 453-458). Effectively, the chromium based bonding scheme has better phonon compatibility when compared to the standard titanium-platinum bonding. That is, transfer of heat via electron flow in the metal bond to phonon propagation in the diamond material is improved when using chromium as opposed to titanium-platinum.

Following on from the above, the present inventors have also realized that the efficiency of heat transfer between electron flow in the chromium metal and phonon propagation in the diamond heat spreader will be dependent on the surface structure of the diamond material and the material properties of the diamond, particular at and near the surface of the diamond heat spreader which forms an interface with the chromium metal. For example, different grades of diamond material which have different grain sizes, sp2 carbon content, extended crystallographic defects such as dislocations, and point defect concentrations such as nitrogen-based point defects can also impact on heat transfer across the diamond metal boundary. As such, tailoring the diamond defect structure by changing the aforementioned variables, can be used to optimize phonon properties and can lead to an improved metallized diamond heat spreader product for use in high power density applications In addition to the types of materials used to bond diamond to another component, the layer thicknesses of the materials also affects the thermal barrier resistance of the bond. For example, the layer of chromium bonded to the diamond heat spreader may have a thickness in a range 5 nm to 500 nm or 50 nm to 250 nm. A further metal layer, such as gold, disposed on the chromium may have a layer thickness in a range 100 nm to 1 micrometer or 300 nm to 700 nm. The layer of metal disposed on the chromium may have a thickness in a range 5 µm to 100 µm or 15 µm to 40 µm when a solder or braze is applied, i.e. including the solder or braze.

As previously described, the advantageous technical effect of utilizing chromium instead of titanium-platinum is observed when operating at high power densities. The equivalent CW areal power density of the semiconductor component may be at least 1 kW/cm$^2$, 2 kW/cm$^2$, 5 kW/cm$^2$, 10 kW/cm$^2$, 20 kW/cm$^2$, 50 kW/cm$^2$ or 100 kW/cm$^2$, 1 MW/cm$^2$, 2 MW/cm$^2$, 4 MW/cm$^2$, 6 MW/cm$^2$, 8 MW/cm$^2$, or 10 MW/cm$^2$. Alternatively, or additionally, the linear power density of the semiconductor component may be at least 1 W/mm, 2 W/mm, 2.5 W/mm, 3 W/mm, 4 W/mm, 6 W/mm, 8 W/mm, or 10 W/mm. It has been found that in general the larger the power density the larger the benefits of using a chromium-based bonding solution instead of a Ti/Pt based bonding scheme. The most suitable power density definition will depend on the type of semiconductor device. For high power density RF devices the power density is usually defined as a linear power density in terms of Watts per unit gate width. However, for other devices such as laser diodes, light emitting diodes, power switches and microprocessors an areal power density measurement is more appropriate. In the latter case it is the area of the active region which is key, be it light emitting or current switched.

The present invention also provides a metallized diamond heat spreader comprising:

a diamond heat spreader; and a metal coating disposed on the diamond heat spreader, wherein the metal coating comprises a layer of chromium bonded to the diamond heat spreader and a further metal layer, such as gold, disposed over the layer of chromium, and wherein the diamond heat spreader has one or more of the following characteristics:

a surface roughness Rq of no more than 1000 nm, 500 nm, 100 nm, 50 nm, 20 nm, 10 nm, or 5 nm;

a thermal conductivity of at least 1000 W/mK, 1300 W/mK, 1500 W/mK, 1800 W/mK, or 2000 W/mK;

a nitrogen concentration of less than 20 parts per million;

a low or absent graphitic sp2 carbon signal as assessed by Raman spectroscopy at an excitation wavelength of 633 nm; and a Raman full width half maximum (FWHM) peak width of no more than 20, 10, 8, 5, 3, 2, or 1.5 cm$^{-1}$.

Such a metallized diamond heat spreader can be used in high power density semiconductor devices as previously described. Furthermore, the diamond heat spreader may also be used as an optical component in high power optical devices. In the latter case, a low optical absorption grade of diamond material is selected for the diamond component such that both thermal and optical requirements are met for such applications.

Figure 1B:
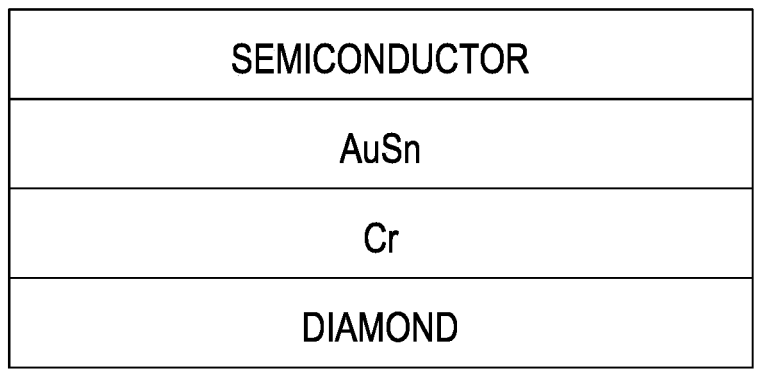

FIGS. 1(a) and 1(b) show schematic cross-sectional illustrations of a semiconductor component bonded to a diamond heat spreader using a standard Ti/Pt bonding scheme and a chromium-based bonding scheme respectively. FIG. 1(a) shows a device structure which utilizes a standard titanium-platinum metallization and comprises the layer structure-diamond/Ti/Pt/AuSn/semiconductor component. FIG. 1(b) shows a device structure which utilizes a chromium metallization and comprises the layer structure-diamond/Cr/AuSn/semiconductor component. These two bonding solutions have been used to show the benefits of using the chromium-based bonding scheme in high power density applications. The layer thicknesses for the metallization coatings on the diamond in each arrangement are as follows: Ti/Pt/Au-100/120/500 nm; Cr/Au-100/500 nm. A tin-based solder having a thickness of 25 micrometers was used to bond the metallized diamond components to semiconductor components.

Figure 2A:
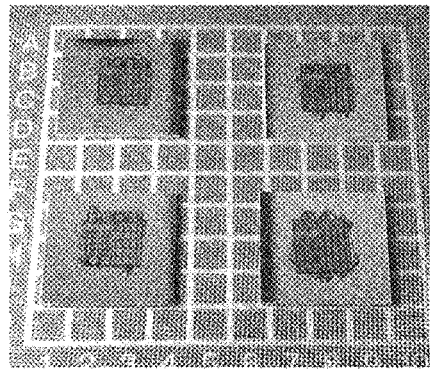
FIG. 2(a) shows four GaN-on-SiC samples, each attached to a 10×10 mm$^2$ diamond heat spreader.
Figure 2B:
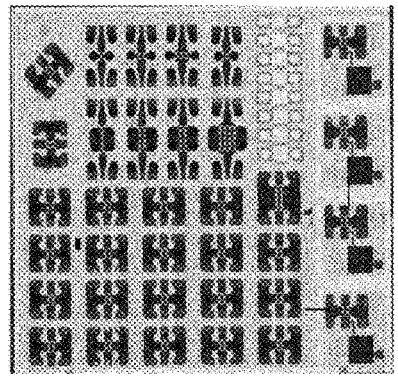
FIG. 2(b) shows one of the samples in more detail illustrating that each sample is mounted with several high electron mobility transistors (HEMTs), each having four fingers and different device lengths.

FIG. 2(a) shows four HEMTs fabricated on GaN-on-SiC samples, each attached to a 10×10 mm$^2$ diamond heat spreader. Each of the diamond heat spreaders is formed of polycrystalline diamond material from Element Six. FIG. 2(b) shows one of the samples in more detail illustrating that each sample is mounted with several HEMTs, each having four fingers and different device lengths.

Figure 3:
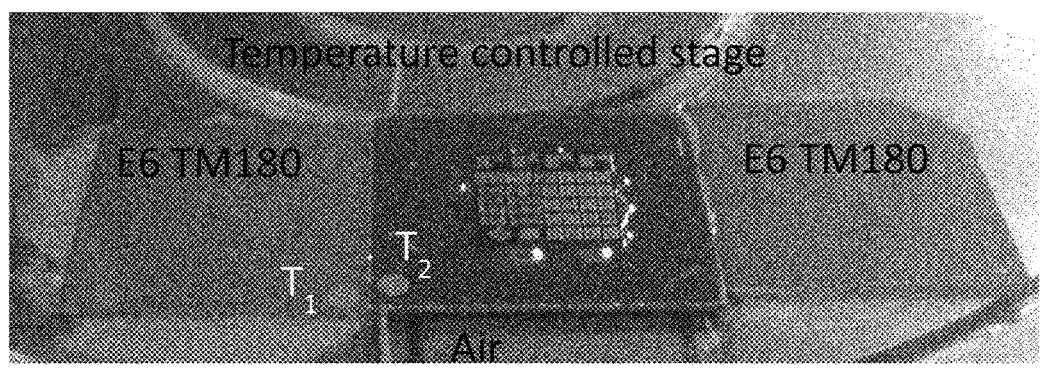
FIG. 3 shows an experimental set-up in which energy dissipation is completely controlled to keep the same conditions for all the samples and enable a direct comparison between samples with $T_1$ and $T_2$ identical in all the samples.
Figure 4:
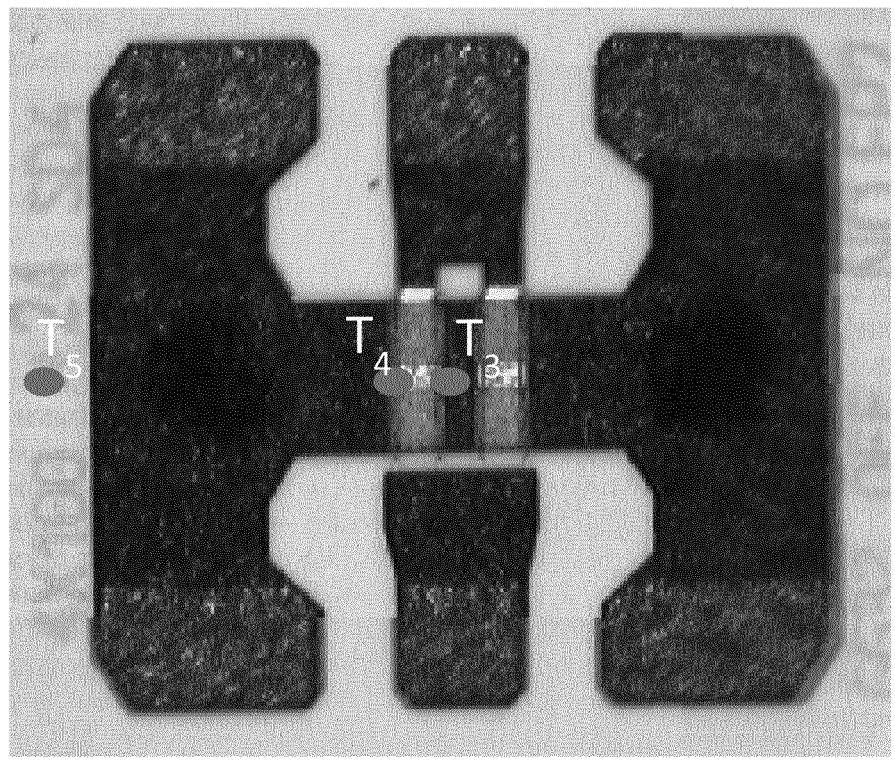
FIG. 4 shows a single HEMT structure illustrating three further temperature measurements $T_3$ to $T_5$ in addition to $T_1$ and $T_2$ illustrated in FIG. 3—the power profiles of the five temperatures $T_1$ to $T_5$ solved simultaneously allows one to extract the unknown variables: (i) Gan/SiC thermal barrier resistance (TBR); (ii) SiC thermal conductivity ($T_c$); (iii) solder layer thermal conductivity ($T_c$); (iv) sample/diamond (TM180) thermal resistance; and (v) diamond (TM180)/temperature-controlled-stage thermal resistance.

FIG. 3 shows an experimental set-up in which energy dissipation is completely controlled to keep the same conditions for all the samples and enable a direct comparison between samples with $T_1$ and $T_2$ identical in all the samples. FIG. 4 shows a single HEMT structure illustrating three further temperature measurements $T_3$ to $T_5$ in addition to $T_1$ and $T_2$ illustrated in FIG. 3. The power profiles of the five temperatures $T_1$ to $T_5$ solved simultaneously allows one to extract the unknown variables: (i) Gan/SiC TBR; (ii) SiC $T_c$; (iii) solder layer $T_c$; (iv) sample/diamond thermal resistance; and (v) diamond/temperature-controlled-stage thermal resistance.

Figure 5:
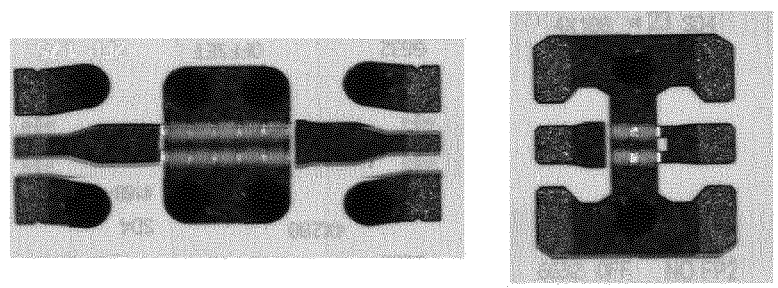
FIG. 5 shows an example of a small device and an example of a large device—$T_5$ in small devices and $T_3$ in large devices (corresponding to the temperature locations illustrated in FIG. 4) are very sensitive to the solder thermal conductivity.

FIG. 5 shows an example of a small device and an example of a long device. $T_5$ in small devices and $T_3$ in long devices (corresponding to the temperature locations illustrated in FIG. 4) are very sensitive to the solder thermal conductivity.

Figure 6:
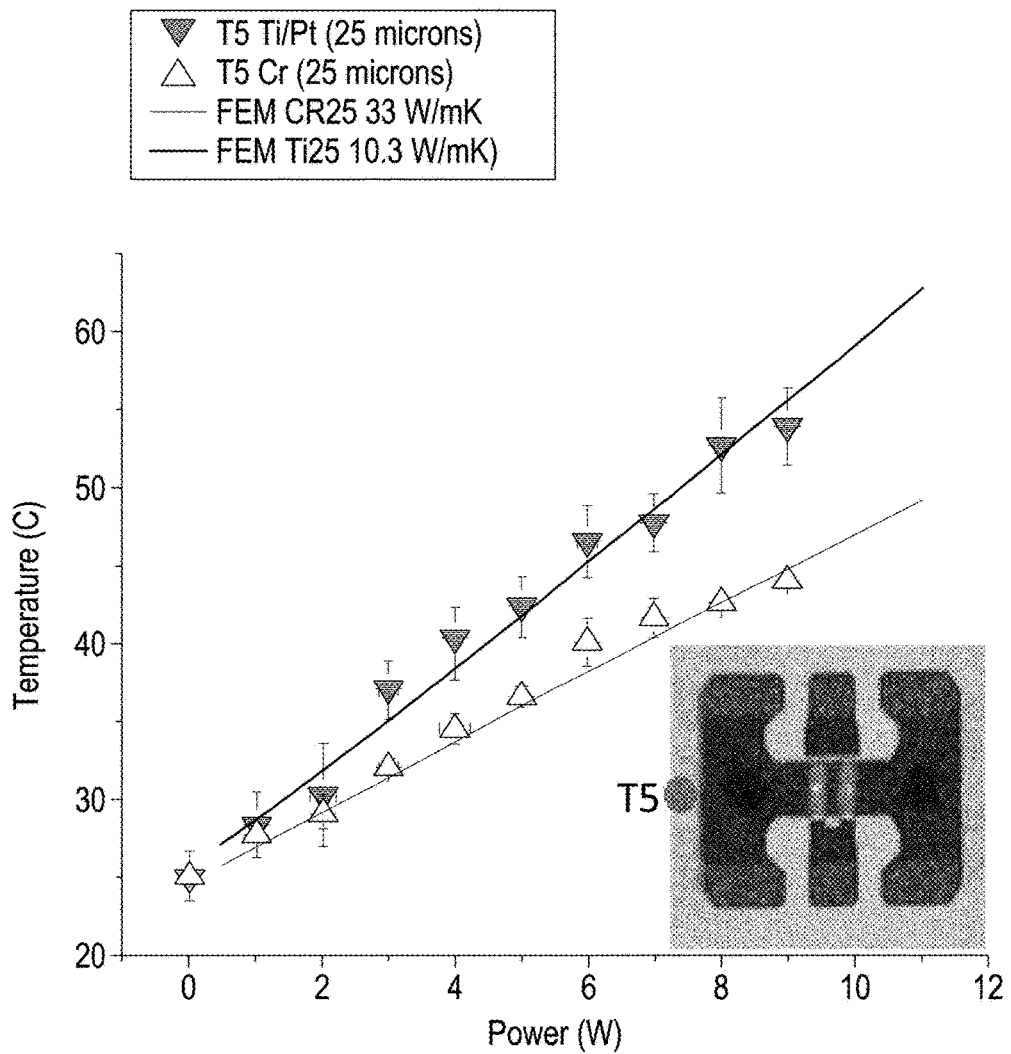
FIG. 6 shows a plot of temperature $T_5$ versus power comparing a device comprising a Ti/Pt based bond with a device comprising a Cr based bond and showing that as power is increased then the Cr based bond leads to a significant reduction in the temperature $T_5$.
Figure 7:
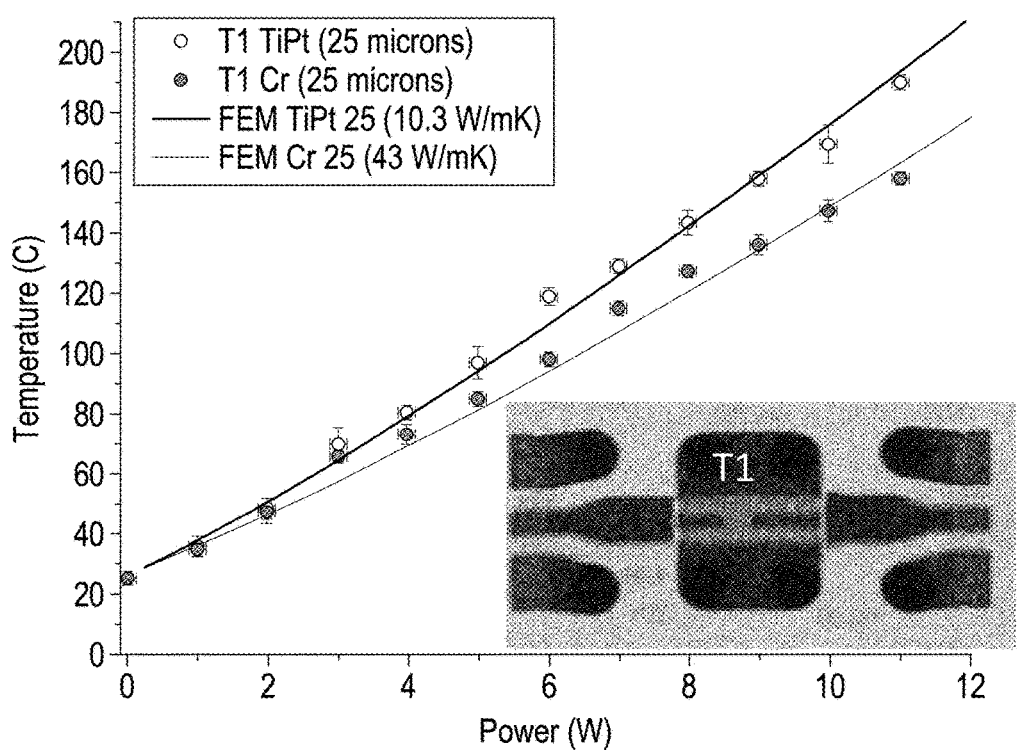
FIG. 7 shows a plot of temperature $T_1$ versus power comparing a device comprising a TiPt based bond with a device comprising a Cr based bond and showing that as power is increased then the Cr based bond leads to a significant reduction in the temperature $T_1$.

The thermal conductivity of the standard TiPtAu metallization is located in the average of the commercial devices tested with this metallization scheme (13±3 W/mK). The new metallization scheme improves the thermal conductivity of the die-attach by a factor of three to four. In these devices the peak/channel temperature at normal operation is a ~13% lower with the new chromium-based bonding scheme. The test devices are small transistors (4 fingers, 100-275 μm gate width). The temperature in these small devices is mainly controlled by the thermal management of the die, not by the package which the diamond heat spreader is mounted. In this regard, FIG. 6 shows a plot of temperature $T_5$ versus power comparing a device comprising a Ti/Pt based bond with a device comprising a Cr based bond and showing that as power is increased then the Cr based bond leads to a significant reduction in the temperature $T_5$. FIG. 7 shows a plot of temperature $T_1$ versus power comparing a device comprising a Ti/Pt based bond with a device comprising a Cr-based bond and showing that as power is increased then the Cr-based bond leads to a significant reduction in the temperature $T_1$. The results in FIG. 6 and the subsequent Figure are for a Cr metallization and a comparative TiPt metallization both of which have a 25 micrometer thick AuSn solder disposed thereon.

Figure 8:
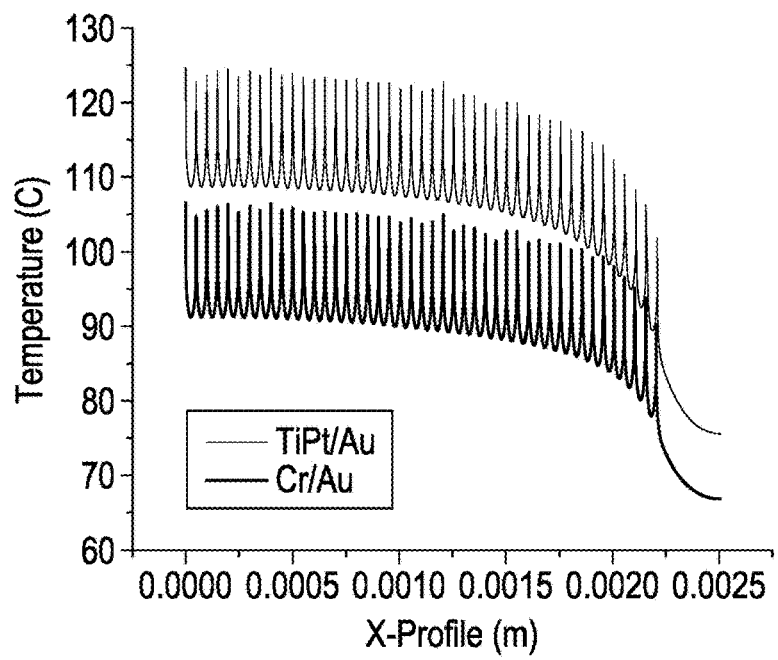
FIG. 8 shows a plot of temperature versus X-profile comparing a very high density 90 fingers GaN-on-SiC high performance analogue (HPA) device comprising a Ti/Pt based bond with the same device mounted using a Cr based bond and showing that the Cr-based bond leads to a significant reduction in the temperature across the X-profile of the device.
Figure 9:
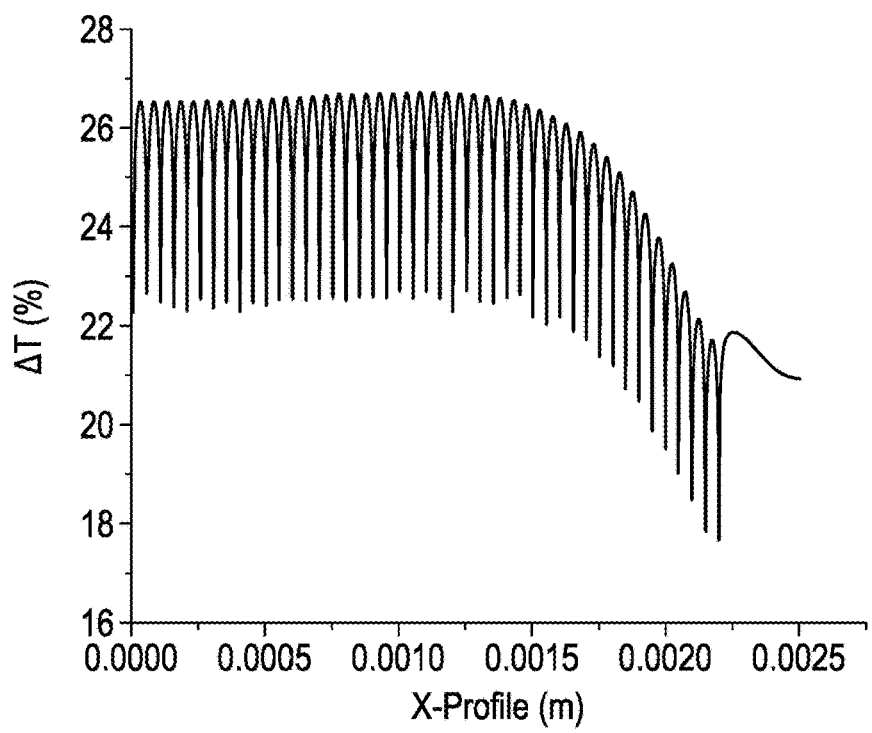
FIG. 9 shows a plot of the temperature ratio between the two devices of FIG. 8 illustrating an approximately 25% reduction in temperature across the device in moving from a Ti/Pt based bond to a Cr based bond.
Figure 10:
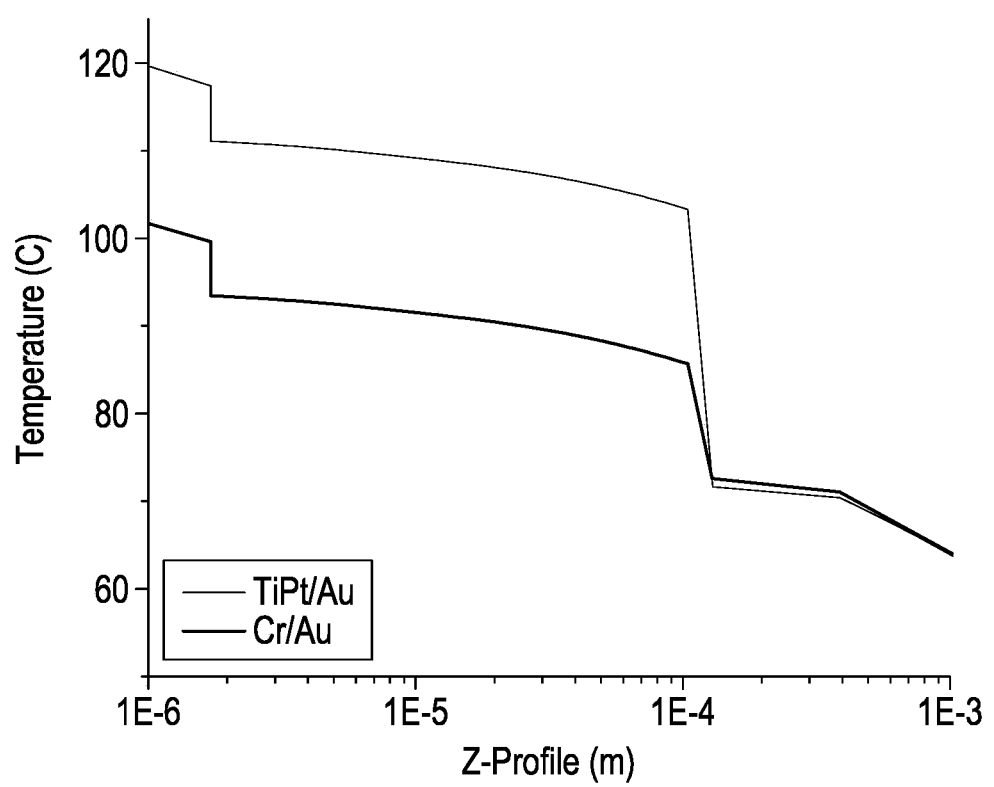
FIG. 10 shows a plot of temperature versus Z-profile comparing a very high power density GaN-on-SiC HPA device comprising a Ti/Pt based bond with a device comprising a Cr based bond and showing that the Cr based bond leads to a significant reduction in the temperature through the Z-profile of the device.

A real GaN-on-SiC HPA 90 fingers device operated at 50V and 1A mounted under real conditions in a window-package has been simulated to test the impact of the metallization approach described herein. FIG. 8 shows a plot of temperature versus X-profile comparing a device comprising a Ti/Pt based bond with a device comprising a Cr based bond and showing that the Cr-based bond leads to a significant reduction in the temperature across the X-profile of the device. FIG. 9 shows a plot of a temperature difference between the two devices of FIG. 8 illustrating an approximately 25% reduction in temperature across the device in moving from a Ti/Pt based bond to a Cr-based bond. FIG. 10 shows a plot of temperature versus Z-profile comparing a device comprising a Ti/Pt based bond with a device comprising a Cr-based bond and showing that the Cr-based bond leads to a significant reduction in the temperature through the Z-profile of the device.

Figure 11:
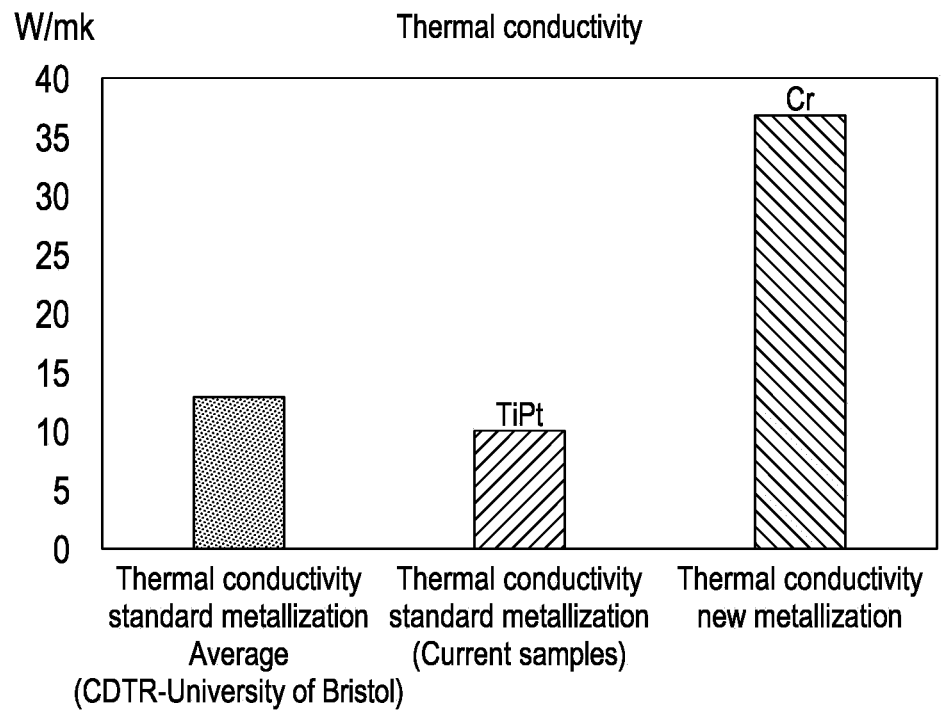
FIG. 11 shows a plot of thermal conductivity for different bonding solutions illustrating that the thermal conductivity of a solder layer with the new Cr metallization is 4-times higher than the standard thermal conductivity of this layer with a Ti/Pt metallization scheme.

FIG. 11 shows a plot of thermal conductivity for different bonding solutions illustrating that the thermal conductivity of a solder layer with the Cr-metallization described herein is four times higher than the standard thermal conductivity of this layer with a Ti/Pt metallization scheme.

Figure 12:
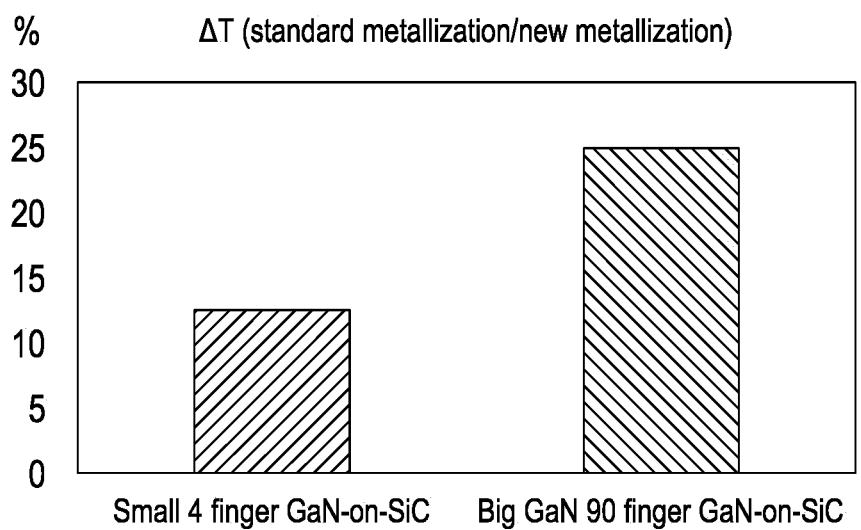
FIG. 12 shows a plot of the difference in channel temperature between a device comprising the standard Ti/PT metallization versus the Cr metallization for two different GaN-on-SiC devices analysed, a small device with a very localised heat generation and a very high power GaN-on-SiC HPA, showing the improvement achieved in the reduction of the channel temperature: 25% for large HPAs and 12% for small devices—this result summarizes the huge improvement when the Cr metallization is applied in devices which require very high power dissipation.

FIG. 12 shows a plot of the difference in channel temperature between a device comprising the standard Ti/PT metallization versus the Cr-metallization describe herein for two different devices indicating that the temperature in the channel is between a 25% (big HPAs) and a 12% (small devices) higher in devices with the standard metallization scheme compared with the Cr-based metallization scheme.

These results indicate that while the impact on the thermal management of the chromium-based metallization scheme may be negligible for lower power devices it becomes very significant for very high power semiconductor devices.

It is also envisaged that the metal coated diamond heat spreader as described herein may be used in other applications such as optical devices where both thermal and optical properties of the diamond material may be utilized, e.g. a high power laser window. In a range of applications a mounted diamond component may be provided comprising a metal coated diamond heat spreader as described herein which is adhered to another component via a solder or braze bond or otherwise adhered to another device component without any solder or braze, e.g. via pressure bonding. However, the bonding solution as described herein has been found to be particularly effective in very high power semiconductor device applications.

While this invention has been particularly shown and described with reference to embodiments, it will be understood by those skilled in the art that various changes in form and detail may be made without departing from the scope of the invention as defined by the appending claims.

The invention claimed is:
1. A semiconductor device comprising:
 a semiconductor component;
 a diamond heat spreader; and
 a metal bond,
 wherein the semiconductor component is bonded to the diamond heat spreader via the metal bond,
 wherein the metal bond comprises a layer of chromium directly bonded to the diamond heat spreader and a further metal layer disposed between the layer of chromium and the semiconductor component, and
 wherein the semiconductor component is configured to operate at an areal power density of at least 1 kW/cm$^2$ and/or a linear power density of at least 1 W/mm.
2. A semiconductor device according to claim 1,
 wherein the layer of chromium has a thickness in a range 5 to 500 nm.
3. A semiconductor according to claim 1,
 wherein the further metal layer comprises one or more of gold, silver, tantalum and tin.
4. A semiconductor device according to claim 1,
 wherein the further metal layer has a thickness in a range of 5 to 100 μm including a solder or braze material.
5. A semiconductor device according to claim 4,
 wherein the further metal layer has a thickness in a range 15 to 40 μm including the solder or braze material.
6. A semiconductor device according to claim 1,
 wherein the areal power density of the semiconductor component is at least 2 kW/cm$^2$.
7. A semiconductor device according to claim 1,
 wherein the linear power density of the semiconductor component is at least 2 W/mm.
8. A semiconductor device according to claim 1,
 wherein the diamond heat spreader has one or more of the following characteristics:
 a surface roughness Rq of no more than 1000 nm;
 a thermal conductivity of at least 1000 W/mK;
 a nitrogen concentration of less than 20 parts per million;
 a low or absent graphitic sp2 carbon signal as assessed by Raman spectroscopy at an excitation wavelength of 633 nm; and
 a Raman full width half maximum (FWHM) peak width of no more than 20 cm$^{-1}$.
9. A metallized diamond heat spreader comprising:
 a diamond heat spreader; and
 a metal coating disposed on the diamond heat spreader,
 wherein the metal coating comprises a layer of chromium directly bonded to the diamond heat spreader and a further metal layer disposed over the layer of chromium, and
 wherein the diamond heat spreader has one or more of the following characteristics:
 a surface roughness Rq of no more than 1000 nm;
 a thermal conductivity of at least 1000 W/mK;
 a nitrogen concentration of less than 20 parts per million;

a low or absent graphitic sp2 carbon signal as assessed by Raman spectroscopy at an excitation wavelength of 633 nm; and a Raman full width half maximum (FWHM) peak width of no more than 20 $cm^{-1}$.

10. A metallized diamond heat spreader according to claim 9, wherein the layer of chromium has a thickness in a range 5 to 500 nm.

11. A metallized diamond heat spreader according to claim 9, wherein the further metal layer is selected from any of gold, silver, tantalum, and tin.

12. A metallized diamond heat spreader according to claim 9, wherein the further metal layer has a thickness in a range of 100 nm to 1 micrometer.

13. A metallized diamond heat spreader claim 9, wherein the metal coating is a two-layer coating consisting only of the layer of chromium and the further metal layer.

14. An optical component comprising a mounted diamond component comprising the metallized diamond heat spreader according to claim 9 adhered to another device.

15. A semiconductor component comprising the mounted diamond component comprising the metallized diamond heat spreader according to claim 9 adhered to another device.

* * * * *